(12) United States Patent
Iwasaki

(10) Patent No.: US 11,290,203 B2
(45) Date of Patent: Mar. 29, 2022

(54) CIRCUITRY FOR REMOTE OPTICAL COMMUNICATIONS DEVICES AND METHODS UTILIZING SAME

(71) Applicant: Sean Iwasaki, Chicago, IL (US)

(72) Inventor: Sean Iwasaki, Chicago, IL (US)

(*) Notice: Subject to any disclaimer, the term of this patent is extended or adjusted under 35 U.S.C. 154(b) by 0 days.

(21) Appl. No.: 16/839,334

(22) Filed: Apr. 3, 2020

(65) Prior Publication Data
US 2020/0295862 A1 Sep. 17, 2020

Related U.S. Application Data

(63) Continuation-in-part of application No. 15/687,862, filed on Aug. 28, 2017, now Pat. No. 10,637,776.

(60) Provisional application No. 62/381,168, filed on Aug. 30, 2016.

(51) Int. Cl.
| | | |
|---|---|---|
| H04J 14/02 | (2006.01) |
| H01Q 1/22 | (2006.01) |
| H03F 3/45 | (2006.01) |
| H04L 12/931 | (2013.01) |
| H04B 10/077 | (2013.01) |
| H04B 10/079 | (2013.01) |
| H04L 12/935 | (2013.01) |
| H04L 49/351 | (2022.01) |

(52) U.S. Cl.
CPC .......... *H04J 14/0283* (2013.01); *H01Q 1/22* (2013.01); *H03F 3/45* (2013.01); *H04L 49/351* (2013.01)

(58) Field of Classification Search
CPC ....... H04L 45/60; H04L 49/109; H04L 49/30; H04L 49/355
See application file for complete search history.

(56) References Cited

U.S. PATENT DOCUMENTS

| | | | | |
|---|---|---|---|---|
| 5,368,041 A * | 11/1994 | Shambroom | ........ | A61B 5/0006 600/544 |
| 7,636,802 B1 * | 12/2009 | Baxter | ............ | H03K 19/17744 710/33 |
| 10,637,776 B2 * | 4/2020 | Iwasaki | ................... | H04L 49/30 |
| 2007/0086792 A1 * | 4/2007 | Regev | ................. | H04B 10/697 398/209 |
| 2011/0134988 A1 * | 6/2011 | Chen | ................. | H04L 25/03038 375/230 |
| 2011/0191503 A1 * | 8/2011 | Kakish | .................... | G06F 13/10 710/15 |
| 2014/0016479 A1 * | 1/2014 | Coomber | .......... | H04L 12/40013 370/241.1 |
| 2016/0098336 A1 * | 4/2016 | Loebig | .................... | G06F 13/10 710/16 |
| 2020/0295862 A1 * | 9/2020 | Iwasaki | .................... | H01Q 1/22 |

* cited by examiner

*Primary Examiner* — Harry H Kim
(74) *Attorney, Agent, or Firm* — Charles T. Riggs, Jr.

(57) ABSTRACT

The present subject matter relates to methods, systems, devices, circuitry and equipment providing for communication service to be transported between first and second networks and which monitors the communication service and/or injects test signals over two fiber cables. A first single fiber cable is used to interface the communication services between the first and second network. A second single fiber cable is used to monitor the communication services and/or inject signals. The circuitry comprises a plurality of input amplifiers, output amplifiers, and multiplexer switches between a plurality of port connectors. An SFP module is inserted in all ports, and the SFP modules connect to one or more fiber optic cables.

20 Claims, 6 Drawing Sheets

CIRCUITRY FOR REMOTE OPTICAL COMMUNICATIONS DEVICES AND METHODS UTILIZING SAME

RELATED APPLICATION(S)

This application is a continuation-in-part of U.S. application Ser. No. 15/687,862 entitled Multi-functional Circuity for Communications Networks and Methods and Devices Utilizing Same, filed Aug. 28, 2017, now U.S. Pat. No. 10,637,776, the entire disclosure of which is herein incorporated by reference.

BACKGROUND

The current communication infrastructure is an extremely complex patch of networks. The typical communication infrastructure is comprised of different service provider networks, where each service provider network is unique. Each service provider network will be comprised of different equipment and solution providers. Each service provider network will also operate and service their customers in a proprietary manner. With the 5G wireless network, the service provider must provide a higher quality and reliable communication service to their customers. The service provider will typically use an optical bridge or splitter device to monitor their communication service, but this type of device is decreasing the quality and reliability of 5G type communication services.

One such prior art optical bridge or splitter device is illustrated in the diagram of FIG. 1 (prior art), which depicts use of an "Optical Splitter" device in a communications network. An optical splitter is a passive device, which splits an optical fiber into two separate optical fibers. The optical fiber split is based upon a percentage ratio, which the ratio is dependent upon the optical splitter application. The optical splitter used for monitoring applications has a typical split ratio of 90/10, where 90% of the optical signal is passed-through. The 10% portion of the optical signal is connected to a test monitor equipment.

The optical splitter is typically connected as shown in FIG. 1 (prior art). As used therein, the reference letters "LC" represent a duplex or two fiber connectors, where each fiber connector interfaces a transmit and a received fiber cable, respectively. The LC type connector is typically used as a fiber connector for fiber communication equipment.

There are numerous disadvantages to the optical splitter design shown in FIG. 1 (prior art). First, this optical splitter requires three fiber cables (i.e. fiber cable 1, 2, & 3). Second, this optical splitter decreases or attenuates the optical signal level carried over fiber cable 1 (i.e. 90%), which decreases the operating distance of the optical signal. Third, this optical splitter design fuses two fibers to provide the split ratio. This glass fusing adds physical discontinuity to the fiber cable, where the glass fusing inherently adds impairments to the communication signal. These impairments create signal distortions, wherein these signal distortions affect the reliability of the communication signal. Fourth, this optical splitter significantly reduces the signal level of the monitored signal due to the 10% ratio. The monitored optical signal operating distance is limited.

Another known prior art signal monitoring method is illustrated in the diagram of FIG. 2 (prior art), which depicts use of two equipment nodes, the "monitoring node" and the "reflector node". The monitoring node is placed at the serving or source network and the reflector node is placed at the end of the network. As an example, the service provider will install the monitoring node at the central office type facility and the reflector node is located at the customer premise or the service provider's demarcation. The monitoring node transmits an optical signal to the reflector node, which the reflector node reflects the optical signal back to the monitoring node. The monitoring node will then analyze the reflected optical signal to determine the quality of the communication service.

This method is similarly disadvantageous. Although this method uses two fibers, it requires two proprietary equipment nodes to be installed. The monitor node is installed at the source network (i.e. central office type facility) and the reflector node is installed at the end network (i.e. demarcation). This method is very complex and cost prohibitive. This method may also add physical discontinuity to the fiber cable, where impairments and impedance mismatch are increased. These impairments create signal distortions, wherein these signal distortions can affect the reliability of the communication service.

The following prior art references provide general background information regarding the monitoring and/or testing of optical communications networks, and each are herein incorporated by reference:

U.S. Pat. No. 6,108,074 entitled Optical Switching Assembly for Testing Fiber Optic Device issued to on.

U.S. Pat. No. 7,787,771 B2 entitled Extendable Loop-Back Type Passive Optical Network and Scheduling Method issued to on.

U.S. Pat. No. 8,050,556 B2 entitled In-Band Optical Frequency Division Reflectometry issued to on.

U.S. Pat. No. 8,761,597 B2 entitled Monitoring Node and Reflector Node of an Optical Communication Network, Optical Network, and Method for Operating an Optical Communication Network issued to on.

SUMMARY

The present disclosure relates to one or more methods, systems, devices and circuitry which allows communication service to be transported between first and second networks and which monitors the communication service over two fiber cables. A first single fiber cable is used to interface the communication services between the first and second network. A second single fiber cable is used to monitor the communication services. The method(s), system(s), device(s) and/or circuitry of the present disclosure uses a first multi-wave SFP (Small Form-factor Pluggable) device to interface the first single fiber cable and a second multi-wave SFP device to interface the second single fiber cable.

The present disclosure provides solutions to address the disadvantages and/or problematic issues with optical bridges or splitters and/or other prior art communications methods, systems and devices. The present disclosure also presents cost effective and operational efficient method(s), system(s) and device(s) in achieving and enhancing the quality and reliability of 5G and future communication services.

The methods, systems, devices and/or circuitry and equipment of the present disclosure provide functionality which:
- allows a Service Provider or user the ability to remotely monitor communication services.
- allows a Service Provider or user the ability to remotely monitor communication services and then inject communication signals.
- will not increase or add attenuation or impairments to the communication signal.

will not require proprietary equipment at the Service Provider facility and remote or customer location.

DETAILED DESCRIPTION

Figure 1:
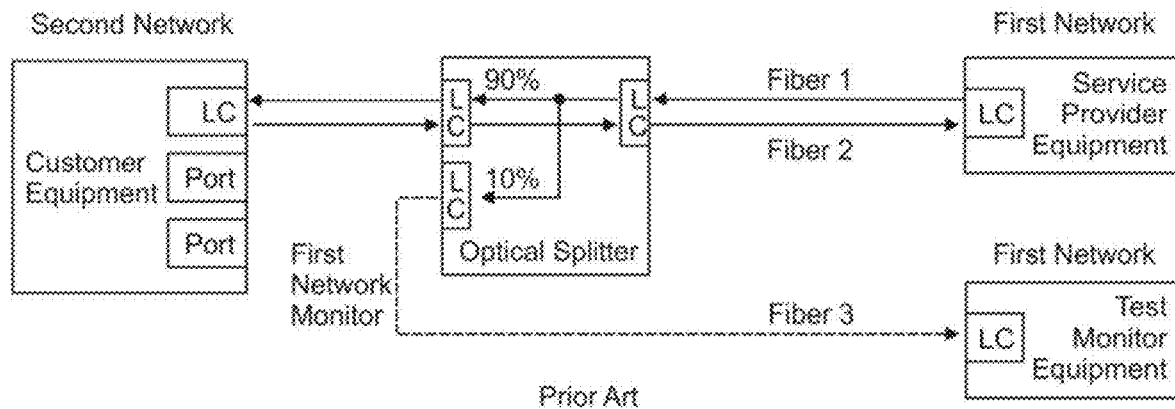
FIG. 1 is a diagram illustrating the use of a prior art optical splitter for monitoring communications network service.
Figure 2:
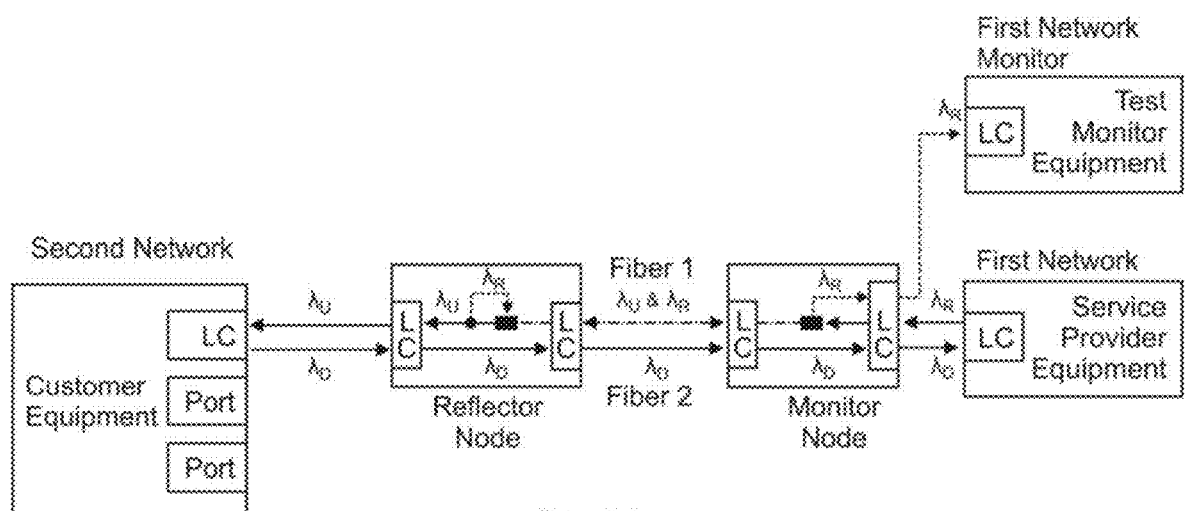
FIG. 2 is a diagram illustrating the use of a prior art Reflector and Monitor Node for monitoring communications network service.

The methods, systems, devices, circuitry and equipment of the present disclosure provide numerous advantages, novel features and/or improvements in providing various communication services for communication networks, including but not limited to providing the functionality of service monitoring via fiber cables. Discussed below and shown in the drawings are some of these advantages, novel features and/or improvements. Additional advantages, novel features and/or improvements will become apparent to those skilled in the art upon examination of the disclosure herein and the accompanying drawings, or may be learned by production or operation of the examples.

Figure 3:
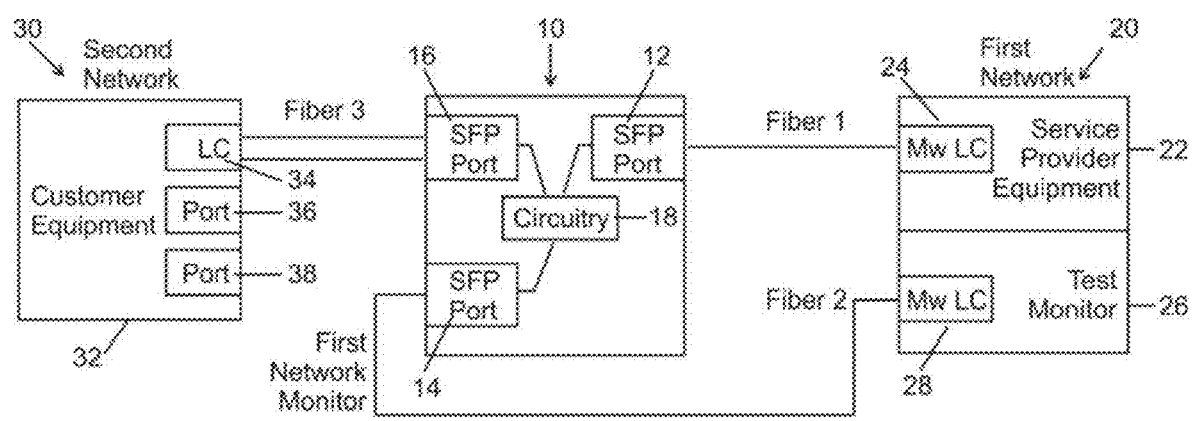
FIG. 3 is a schematic diagram illustrating an embodiment of the communications system and equipment of the present disclosure.

FIG. 3 illustrates an embodiment of the communications system and equipment of the present disclosure. The Remote Optical Communications Device 10 of the present disclosure is operatively connected between a first network 20 and a second network 30, thereby allowing communication service to be transported between first and second networks over a first single fiber cable, and to be monitored and/or injected over a second single fiber cable. The device 10 may be implemented in a mechanical form factor, for example, a network demarcation device, as shown in and described with respect to FIG. 6. It should be understood however that the presently disclosed circuitry could be implemented into other communications equipment, such as test and measurement equipment, surveillance equipment, active optical splitters, central office equipment and OSP type access panels and racks.

The first network includes service provider equipment 22 having a multi-wave fiber optic LC port 24. The first network also includes test monitor equipment 26 having a multi-wave fiber optic LC port 28. The second network includes customer premises equipment 32 having an LC fiber optic port 34 and two additional ports 36, 38. The device 10 includes multiple ports as illustrated, including two multi-wave fiber optic LC ports 12, 14, and a LC fiber optic port 16. The device 10 also has circuitry 18 which defines the signal paths between the ports of the device. The circuitry 18 is comprised of input and output differential amplifiers connected to multiplexer switches, as discussed in more detail below with respect to FIG. 5.

Figure 4:
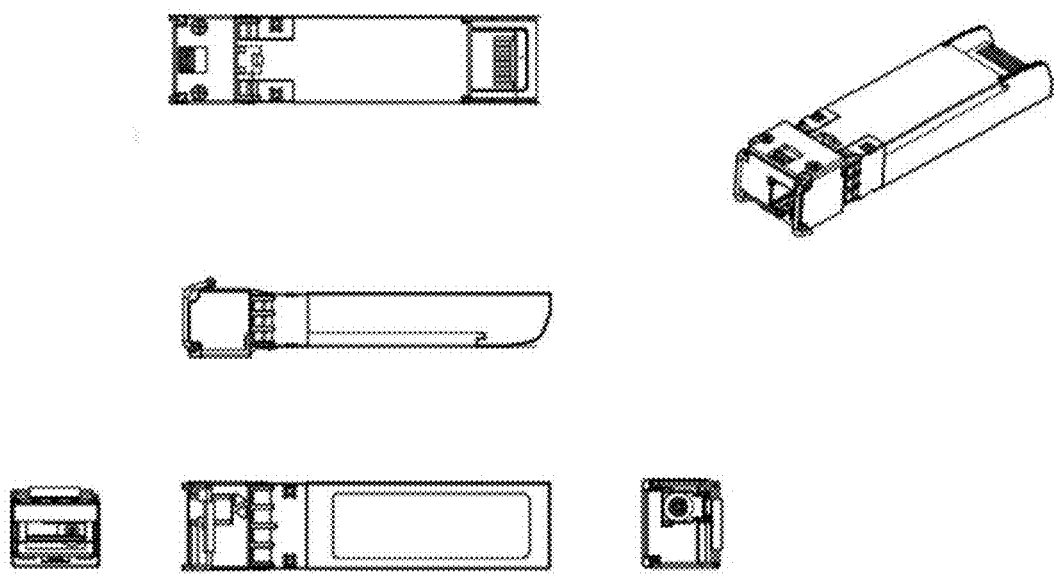
FIG. 4 is a graphical image of a multi-wave SFP device
Figure 5:
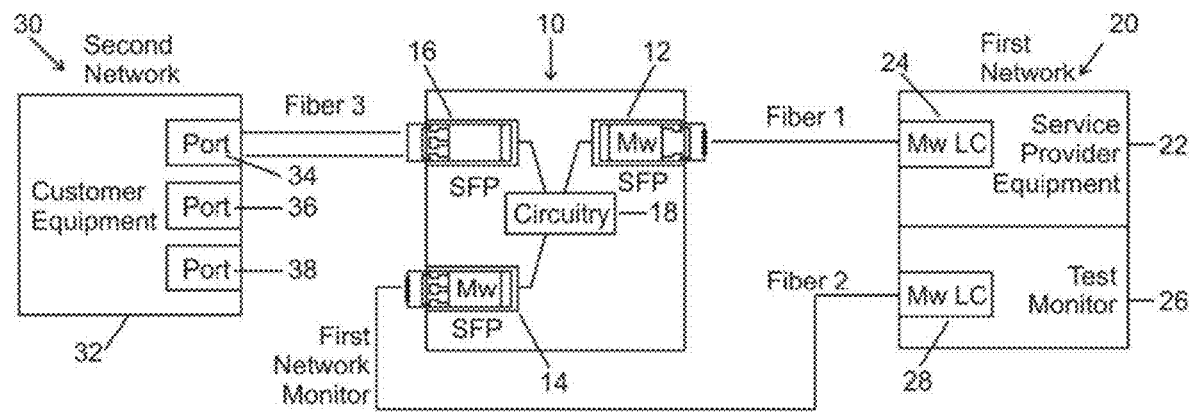
FIG. 5 is a schematic diagram illustrating an embodiment of the communications system, equipment, and SFP devices

A first single fiber cable (Fiber 1) is used to interface the communication services between the first and second network through the device 10, specifically connecting the multi-wave fiber optic LC port 24 of the service provider equipment 22 of the first network 20 to the SFP port 12 of device 10. The device 10 in turn connects to the customer equipment 32 of the second network 30 between SFP port 16 of the device 10 and LC fiber optic port 34 of the customer equipment 32 via a two fiber cables (Fiber 3). A second single fiber cable (Fiber 2) is used to monitor and/or test the communication services, specifically connecting the multi-wave fiber optic LC port 28 of the test monitor equipment 26 of the first network 20 to the SFP port 14 of device 10. The communications device 10 thereby interfaces to the first network 20 via the Fiber 1 cable, and monitors signal from the first network 20 and/or injects a test signal to the first network 20 via the Fiber 2 cable. A multi-wave SFP device (illustrated in FIG. 4) is plugged into each multi-wave LC port 12, 14, 24 and 28, to interface the Fiber 1 cable and the Fiber 2 cable between the respective multi-wave LC ports as illustrated in FIG. 5. Similarly, SFP modules are inserted in the LC ports 16 and 34.

Figure 6:
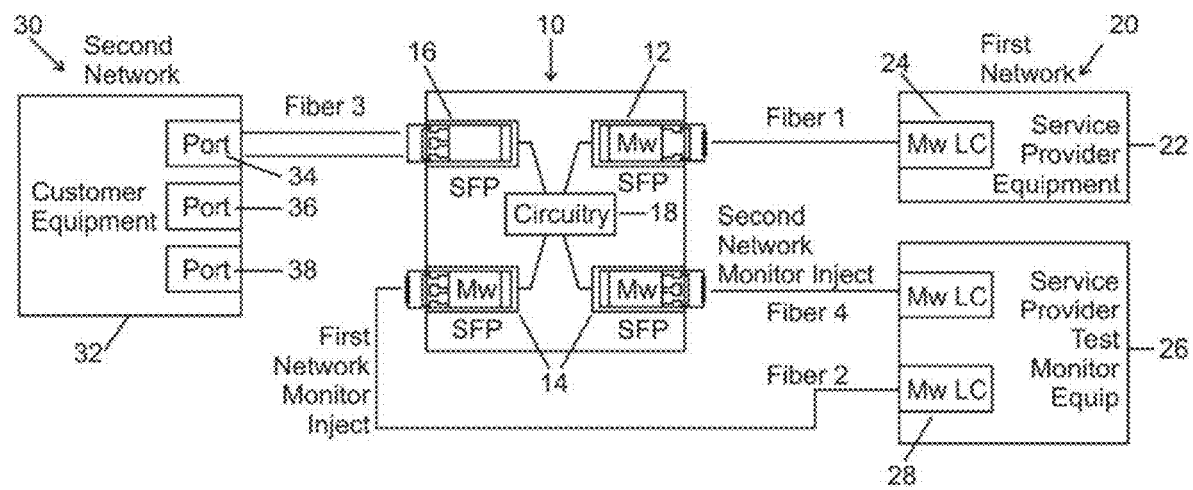
FIG. 6 is a schematic diagram illustrating the communication equipment of the present disclosure providing the functionality of monitoring signals from and injecting into first and second network each using a single fiber cable.

FIG. 6 illustrates one embodiment of the present disclosure in the form of a remote optical communication monitor and test device and system, which may be used in "dark fiber" applications. A dark fiber or unlit fiber is an unused optical fiber, available for use in fiber-optic communication. Dark fiber may be leased from a network service provider.

With respect to monitoring, the methods, circuitry and equipment of the present disclosure provide the ability and functionality of injecting and cut-thru using dark fiber. The user has the flexibility to provide injecting and cut-thru in the SFP port 1, SFP port 4, or both ports. In FIG. 6, the SFP port 3 monitors, injects, or cut-thru signals via the single Fiber 2 cable through the SFP port 1 by means of one single fiber cable, Fiber 1 to the Service Providers Equipment, as schematically illustrated in FIG. 6.

As illustrated in FIG. 6, Primary UpLink corresponds to the connection with the First Network service provider equipment, Primary DownLink corresponds to the connection with the Second Network customer equipment, Primary UpLink Monitor/Inject corresponds to the connection with the First Network Monitor/Inject or Test Monitor equipment, and Primary DownLink Monitor/Inject (FIG. 7) corresponds to the connection with a Second Network Monitor/Inject or Test Monitor equipment (not shown).

This system permits the transport of signals from a first network, and the monitor of a signal from said first network. The system also permits the transport of signals from a first network, the monitor of a signal from said first network, and the injection of a signal to the first network. The system further permits the transport of signals from a first network, the monitor of a signal from said first network, and the injection of a signal to the first network at the demarcation.

Figure 7:
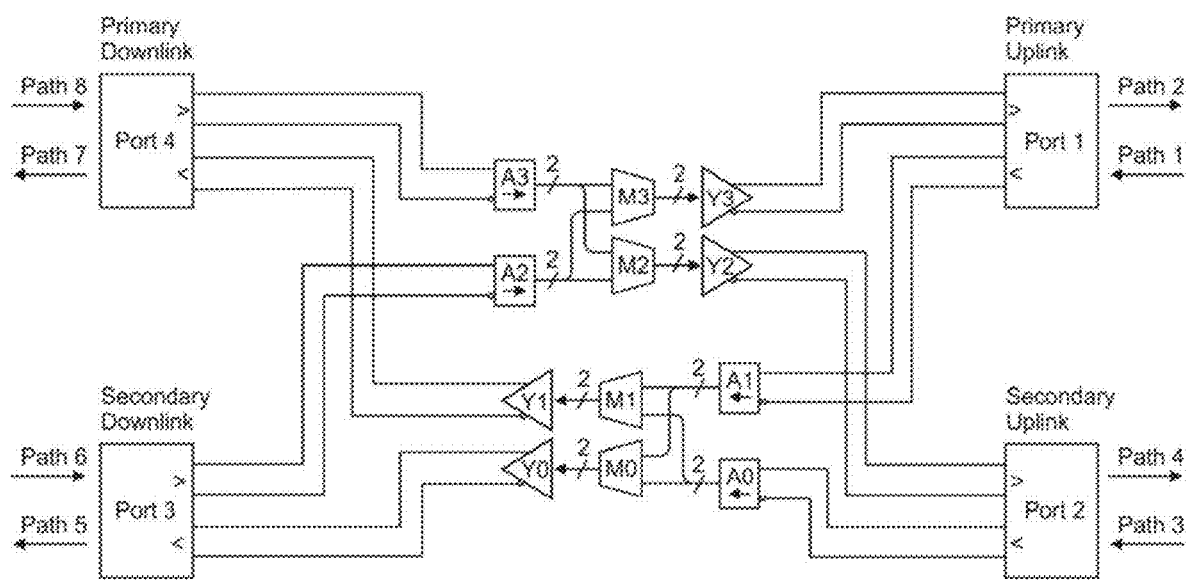
FIG. 7 is a schematic diagram illustrating one embodiment of the circuitry of the present disclosure.

Referring to FIG. 7, schematic diagram illustrating one embodiment of the circuitry of the present disclosure, representing for example a communication device with a plurality of port connectors, which are each connected to an input and output differential amplifier, wherein the differential amplifier connects to a multiplexer switch. The communication device first port connector Port 1 interface signals from a first network. The communication device second port connector Port 2 is configured to monitor a signal from the first network. The second port connector port 2 is also configured to monitor a signal from the first network and inject a signal to the first network. The communication device third port connector Port 3 is configured to interface signals from a second network. The communication device fourth port connector Port 4 is configured to monitor a signal from a second network. The fourth port connector Port 4 is also configured to monitor a signal from a second network and inject a signal to the second network. Further, a SFP module is inserted in all ports. These SFP modules connect to one or more fiber cables.

More specifically, FIG. 7 illustrates a block diagram of circuitry of the present disclosure involving four ports; Port 1, Port 2, Port 3, and Port 4 and eight differential signal paths. Port 1 has two differential signal paths, P1 and P2. Port 2 has two differential signal paths P3 and P4. Port 3 has two differential signal paths P5 and P6. Port 4 has two differential signal paths P7 and P8.

There are four input broadband differential amplifiers A0, A1, A2, and A3. The broadband differential amplifiers provide amplification and conditioning of the input signal. There are four multiplexer switches M0, M1, M2, and M3. The multiplexer switches functions as a crosspoint switch, demultiplexer, or multiplexer for routing the signals. There are four high speed output differential amplifiers Y0, Y1, Y2, and Y3. The high speed output differential amplifiers provide fixed or variable output voltages with and without pre-emphasis. The high speed output differential amplifiers Y0, Y1, Y2, and Y3 each include a retimer.

Port 1 comprises a Path P1 representing an input differential signal and a Path P2 representing an output differential signal. Port 2 comprises a Path P3 representing an input differential signal and a Path P4 representing an output differential signal. Port 3 comprises a Path P6 representing an input differential signal and a Path P5 representing an output differential signal. Port 4 comprises a Path P8 representing an input differential signal and a Path P7 representing an output differential signal.

Path P1 input differential signals connect to the input differential amplifier A1. The output signal from differential amplifier A1 can be a differential or common-mode signal. This output signal from differential amplifier A1 connects to the input of Multiplexer Switch M1 and M0.

Path P2 output differential signals connect to the output differential amplifier Y3. The input signal to differential amplifier Y3 can be a differential or common-mode signal. This input signal to differential amplifier Y3 connects to the output of Multiplexer Switch M3.

Path P3 input differential signals connect to the input differential amplifier A0. The output signal from differential amplifier A0 can be a differential or common-mode signal. This output signal from differential amplifier A0 connects to the input of Multiplexer Switch M0 and M1.

Path P4 output differential signals connect to the output differential amplifier Y2. The input signal to differential amplifier Y2 can be a differential or common-mode signal. This input signal to differential amplifier Y2 connects to the output of Multiplexer Switch M2.

Path P5 output differential signals connect to the output differential amplifier Y0. The input signal to differential amplifier Y0 connects to the output of Multiplexer Switch M0.

Path P6 input differential signals connect to the input differential amplifier A2. The output signal from differential amplifier A2 can be a differential or common-mode signal. This output signal from differential amplifier A2 connects to the input of Multiplexer Switch M2 and M3.

Path P7 output differential signals connect to the output differential amplifier Y1. The input signal to differential amplifier Y1 connects to the output of Multiplexer Switch M1.

Path P8 input differential signals connect to the input differential amplifier A3. The output signal from differential amplifier A3 can be a differential or common-mode signal. This output signal from differential amplifier A3 connects to the input of Multiplexer Switch M3 and M2.

Figure 8:
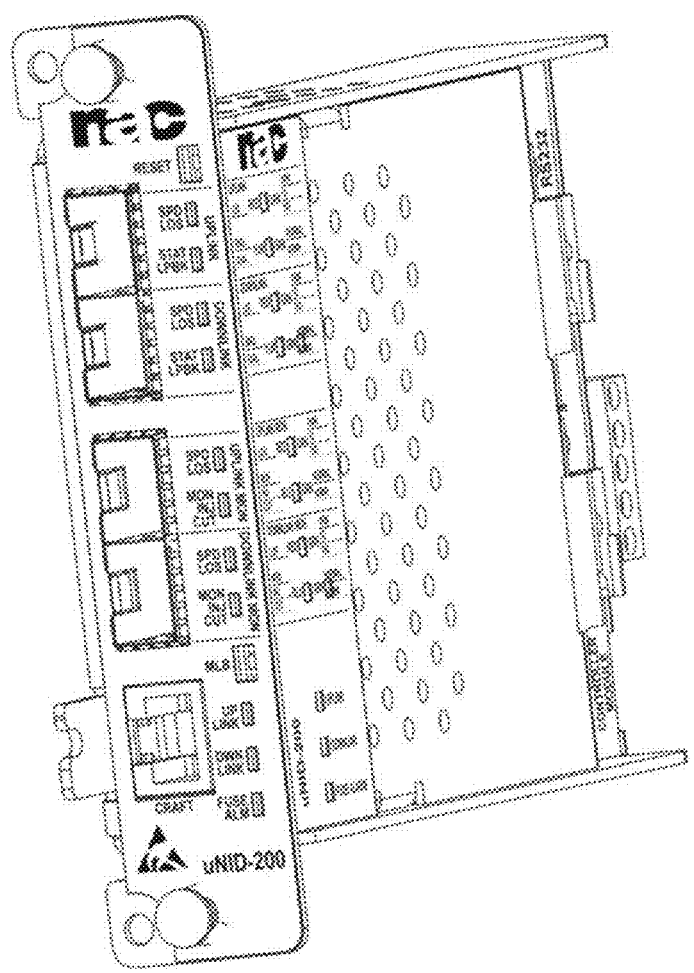
FIG. 8 is a perspective view of an embodiment of the mechanical form factor of the communications device of the present disclosure.

FIG. 8 illustrates a front perspective view of an embodiment of an exemplary communication equipment of the present disclosure. As illustrated, on a front plate, four SFP ports are aligned or positioned in a two by two, front to front orientation. Also on the front plate, an RJ45 jack provides an RS232 craft interface for communication equipment and service status, and equipment provisioning. As illustrated, a top cover is used to protect the electronic circuit assembly. The top cover provides LED indicators for equipment and service status when the communication equipment is horizontally installed on a wall.

As discussed above, the present disclosure describes a method to transport signals from a first network via a first fiber cable and monitor the signal via a second fiber cable. The present disclosure also describes a method to transport signals from a first network via a first fiber cable and monitor the signal and inject a signal to first network via a second fiber cable. The present disclosure further describes a method at a network demarcation to transport signals from a first network via a first fiber cable and monitor the signal and inject a signal to the first network via a second fiber cable.

These methods comprise one or more of the following steps. A first small pluggable form factor SFP module is inserted into the device first port connector. The small pluggable form factor SFP module is an optical wave divisional multiplexer. A second small pluggable form factor SFP module is inserted into the device second port connector. The small pluggable form factor SFP module is an optical wave divisional multiplexer. A third small pluggable form factor SFP module is inserted into the device third port connector. A fourth small pluggable form factor SFP module is inserted into the device fourth port connector.

The device first port connector interfaces with the first network. The device second port connector interfaces with the first network. The device third port connector interface with the second network. The device fourth port connector interfaces with first or second network. In such a configuration, and with the above described circuitry and fiber cables, the functionality described herein is achieved.

More specifically, the circuitry, devices, systems, methods and equipment described herein will allow a Service Provider or user the ability to transport or deliver communication service and remotely monitor said communication service using a single (one) fiber cable, respectively. In other words, a single (one) fiber cable is used to transport and receive communication service and a single (one) fiber cable is used to monitor the communication service.

Further, the circuitry, devices, systems, methods and equipment described herein will allow a Service Provider or user the ability to transport or deliver communication service and remotely monitor the communication service and then inject signals using a single (one) fiber cable without disrupting the monitored communication service. A single (one) fiber cable is used to transport and receive communication service and a single (one) fiber cable is used to monitor said communication service, perform loopback testing, inject signals, and full signal cut-through.

The circuitry, devices, systems, methods and equipment described herein will help the Service Provider or user ensure quality of service for the fiber communication service by monitoring said communication service.

The circuitry, devices, systems, methods and equipment described herein will significantly decrease or eliminate the Service Provider's labor cost (i.e. truck roll) in deploying staff to troubleshoot the communication service due to the implementation of a single (one) fiber cable for transport and a single (one) fiber cable for monitoring.

The circuitry, devices, systems, methods and equipment described herein allows the Service Provider or user the ability to monitor and inject services without the need for two proprietary equipment.

The circuitry, devices, systems, methods and equipment described herein will allow a Service Provider to use any media and manufacturer type of multi-wave optical (CWDM, DWDM, PON) small form factor pluggable devices.

The circuitry, devices, systems, methods and equipment described herein provides a cost-effective solution to remotely monitor and then inject communication signals or signals through a first fiber cable and second fiber cable, respectively.

While the embodiment(s) disclosed herein are illustrative of the structure, function and operation of the exemplary method(s), circuitry, equipment and device(s), it should be understood that various modifications may be made thereto with departing from the teachings herein. Further, the components of the method(s), circuitry, equipment and device(s) disclosed herein can take any suitable form, including any suitable hardware, software, circuitry or other components capable of adequately performing their respective intended functions, as may be known in the art. It should also be understood that all commercially available parts identified herein can be interchanged with other similar commercially available parts capable of providing the same function and results.

While the foregoing discussion presents the teachings in an exemplary fashion with respect to the disclosed method(s), circuitry, equipment, and device(s) for communication services, it will be apparent to those skilled in the art that the present disclosure may apply to other method(s), system(s), device(s), equipment and circuitry for communication services. Further, while the foregoing has described what are considered to be the best mode and/or other examples, it is understood that various modifications may be made therein and that the subject matter disclosed herein may be implemented in various forms and examples, and that the method(s), system(s), device(s), equipment and circuitry may be applied in numerous applications, only some of which have been described herein.

What is claimed is:

1. Communication equipment circuitry for a communication monitoring and testing device interfacing a first network and a second network, comprising:
    a plurality of Small Form-factor Pluggable SFP port connectors each adapted to receive a Small Form-factor pluggable SFP module and connect to a single fiber cable;
    a plurality of input differential amplifiers;
    a plurality of multiplexer switchers; and
    a plurality output differential amplifiers;
    wherein the circuitry defines a plurality of differential signal paths between the plurality of SFP port connectors;
    wherein the plurality of multiplexers are selective determinative of the differential signal paths between an input path of each SFP port connector and an output path of each of at least two other SFP port connectors through one input differential amplifier, and simultaneously two multiplexer switches and two output differential amplifiers.

2. The circuitry of claim 1, wherein a first port connector defines a first path representing an input differential signal and a second path representing an output differential signal.

3. The circuitry of claim 2, wherein a third port connector defines a third path representing an input differential signal and a fourth path representing an output differential signal.

4. The circuitry of claim 3, wherein a third port connector defines a fifth path representing an output differential signal and as sixth path representing an input differential signal.

5. The circuitry of claim 4, wherein a fourth port connector defines a seventh path representing an output differential signal and an eighth path representing an input differential signal.

6. The circuitry of claim 1, wherein each differential amplifier includes a retimer.

7. The circuitry of claim 1, wherein the circuitry is configured to interface media independent SFP modules providing interchangeable interfaces.

8. The circuitry of claim 1, wherein the circuitry is adapted to provide at least one of service monitoring, service protection switching, redundancy, on demand service, security, testing, troubleshooting and service upgrades.

9. A communication monitoring and testing device, comprising:
    a plurality of Small Form-factor Pluggable SFP ports; and
    circuitry defining a plurality of differential signaling paths between the ports,
    the circuitry comprising a plurality of input differential amplifiers, a plurality of multiplexer switchers, and a plurality output differential amplifiers;
    wherein the plurality of differential signaling paths provide at least one of service monitoring and signal injecting via a single fiber cable;
    wherein plurality of multiplexers are selective determinative of the differential signal paths between an input path of each SFP port and an output path of each of at least two other SFP ports through one input differential amplifier, and simultaneously two multiplexer switches and two output differential amplifiers.

10. The device of claim 9, wherein a first port defines a first path representing an input differential signal and a second path representing an output differential signal.

11. The device of claim 10, wherein a second port defines a third path representing an input differential signal and a fourth path representing an output differential signal.

12. The device of claim 11, wherein a third port defines a fifth path representing an output differential signal and a sixth path representing an input differential signal.

13. The device of claim 12, wherein a fourth port defines a seventh path representing an output differential signal and an eight path representing as input differential signal.

14. The device of claim 9, wherein each differential amplifiers includes a retimer.

15. The device of claim 9, further comprising a processor, timing LED indicators, a status and provisioning interface, and power management.

16. The device of claim 9, wherein the device is one of monitoring equipment, a network interface device, a router and an Ethernet switch.

17. A method of providing monitoring, and testing services in communication equipment, comprising the steps of:
- providing a communication device having a plurality of Small Form-factor pluggable SFP ports;
- providing in the communication device circuitry defining a plurality of differential signaling paths between the ports,
- the circuitry comprising a plurality of input differential amplifiers, a plurality of multiplexer switchers and a plurality output differential amplifiers;
- connecting a first port of the communication device to a first network service provider equipment via a first SFP device and a single fiber cable;
- connecting a second port of the communication device to a first network test monitor equipment via a second SFP device and a single fiber cable;
- providing at least one of service monitoring and signal injecting via the second single fiber cable, and
- selectively determining the differential signal paths between an input path of each SFP port and an output path of each of at least two other SFP ports through one input differential amplifier, and simultaneously two multiplexer switches and two output differential amplifiers.

18. The method of claim 17, wherein the SFP ports are media independent for providing interchangeable interfaces.

19. The device of claim 9, wherein the circuitry is configured to interface a media independent SFP module in each SFP port to provide for interchangeable interfaces.

20. The method of claim 17, wherein the communication device performs service monitoring by duplicating a communication service differential signal without altering the differential signal to logic signals for the purpose of monitoring.

* * * * *